(12) United States Patent
Cunningham et al.

(10) Patent No.: US 7,446,526 B2
(45) Date of Patent: Nov. 4, 2008

(54) RF FIELD MAPPING FOR MAGNETIC RESONANCE IMAGING

(75) Inventors: Charles H. Cunningham, San Francisco, CA (US); Krishna S. Nayak, Los Angeles, CA (US); John M. Pauly, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 33 days.

(21) Appl. No.: 11/614,798

(22) Filed: Dec. 21, 2006

(65) Prior Publication Data

US 2008/0150528 A1 Jun. 26, 2008

(51) Int. Cl.
*G01V 3/00* (2006.01)
(52) U.S. Cl. ...................... 324/307; 324/309
(58) Field of Classification Search ............. 324/307, 324/309
See application file for complete search history.

(56) References Cited

U.S. PATENT DOCUMENTS

| 4,788,501 | A | 11/1988 | LeRoux et al. |
| 4,983,921 | A | 1/1991 | Kramer et al. |
| 5,001,428 | A | 3/1991 | Maier et al. |
| 5,107,215 | A | 4/1992 | Schaefer et al. |
| 6,025,718 | A | 2/2000 | Hushek |
| 6,064,203 | A * | 5/2000 | Bottomley .................. 324/309 |
| 6,111,411 | A | 8/2000 | Saranathan et al. |
| 7,038,453 | B2 * | 5/2006 | Feiweier et al. ............. 324/314 |
| 2008/0100292 | A1 * | 5/2008 | Hancu ....................... 324/307 |

OTHER PUBLICATIONS

Cunningham et al., "Saturated Double-Angle Method for Rapid B1+ Mapping", Magnetic Resonance in Medicine 55:1326-1333 (2006).
Cunningham et al., "Saturated double-angle method for rapid B1 mapping", Proc. Intl. Soc. Mag. Reson. Med. 14 (2006).
Xu et al., "Time Efficient Flip Angle Measurement at 7T", Proc. Intl. Soc. Mag. Reson. Med. 14 (2006).
Sung et al., "Experiment and simulation-based optimization of blood-myocardium CNR in cardiac SSFP imaging", Proc. Intl. Soc. Mag. Reson. Med. 14 (2006).
Sung et al., "Validation of B1+ non-uniformity correction in the chest at 3T using TIP-COMP", Proc. Intl. Soc. Mag. Reson. Med. 14 (2006).

* cited by examiner

*Primary Examiner*—Brij B. Shrivastav
*Assistant Examiner*—Megann E Vaughn
(74) *Attorney, Agent, or Firm*—Beyer Law Group LLP

(57) ABSTRACT

For in vivo magnetic resonance imaging at high field ($\geq 3$ T) it is essential to consider the homogeneity of the active $B_1$ field ($B_1+$), particularly if surface coils are used for RF transmission. A new method is presented for highly rapid $B_1+$ magnitude mapping. It combines the double angle method with a $B_1$-insensitive magnetization-reset sequence such that the choice of repetition time (TR) is independent of $T_1$ and with a multi-slice segmented (spiral) acquisition to achieve volumetric coverage with adequate spatial resolution in a few seconds.

12 Claims, 8 Drawing Sheets composite pulse BIR-4 pulse

FIG. 3A　　　　FIG. 3B　　　　FIG. 3C

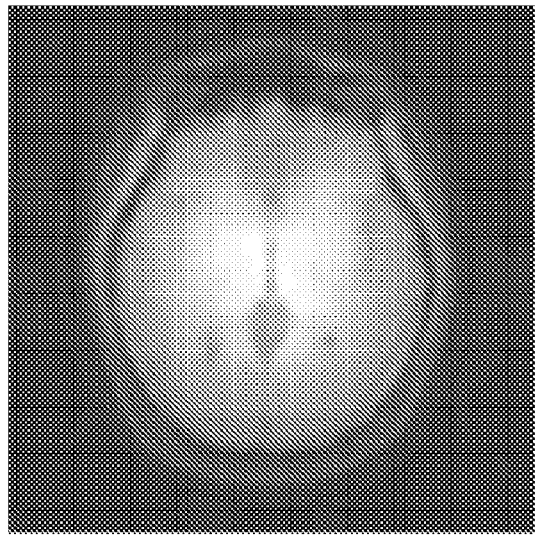 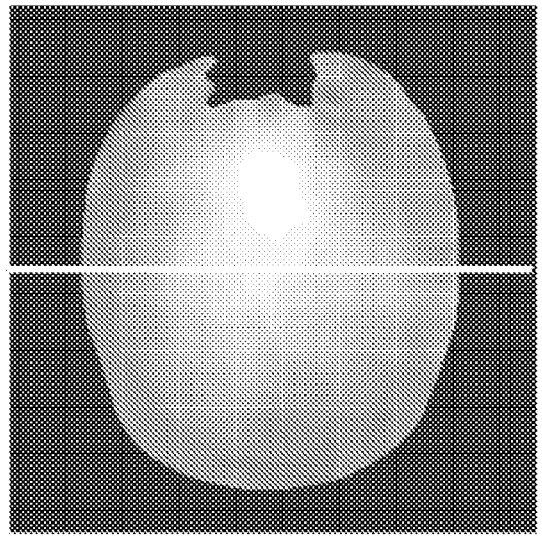
FIG. 5A  FIG. 5B
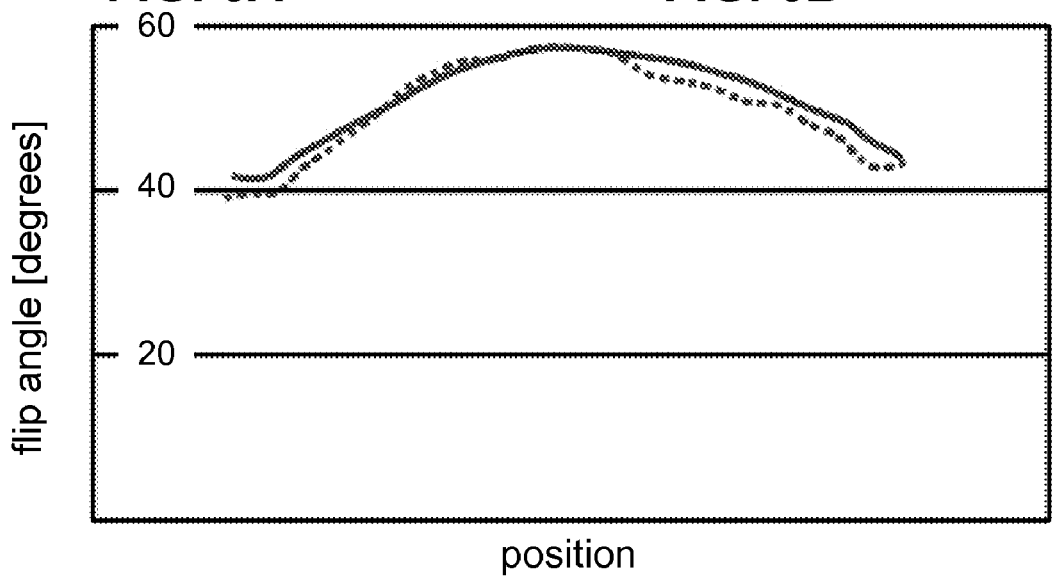
FIG. 5C

FIG. 8A — 2α° image

FIG. 8B — α° image

FIG. 8C — α°(0,60)

RF FIELD MAPPING FOR MAGNETIC RESONANCE IMAGING

STATEMENT REGARDING FEDERALLY SPONSORED RESEARCH OR DEVELOPMENT

The U.S. Government has rights in the disclosed invention pursuant to NIH Grant No. HL074332 to Stanford University and the University of Southern California, and NIH Grant No. EB002992 to Stanford University.

BACKGROUND OF THE INVENTION

This invention relates generally to magnetic resonance imaging (MRI), and more particularly the invention relates to mapping the magnitude of RF fields in a MRI pulse sequence.

Magnetic resonance imaging (MRI) requires placing an object to be imaged in a static magnetic field ($B_0$), exciting nuclear spins in the object with a RF magnetic field ($B_1$), and then detecting signals emitted by the excited spins as they precess within the magnetic field ($B_0$). Through the use of magnetic gradient and phase encoding of the excited magnetization, detected signals can be spatially localized in three dimensions.

For in vivo MRI at high field ($\geq 3$ T) it is essential to consider the homogeneity of the active $B_1$ field ($B_1+$), particularly if surface coils are used for RF transmission. The $B_1+$ field is the transverse, circularly polarized component of $B_1$ that is rotating in the same sense as the magnetization. When exciting or manipulating large collections of spins, nonuniformity in $B_1+$ results in nonuniform treatment of spins. This leads to spatially varying image signal and image contrast and to difficulty in image interpretation and image-based quantification. The $B_1+$ field experienced by spins within the body is influenced by several factors including the distance from the RF transmit coil, tissue dielectric constant, and factors related to the body size and RF wavelength. In high-field ($\geq 3$ T) abdominal, cardiac, and neuro imaging, $B_1+$ inhomogeneity on the order of 30-50% has been predicted and observed. When using surface coil transmission, even greater variations in $B_1+$ can be observed over typical imaging FOVs.

There are several existing $B_1+$ mapping methods based on measurements at progressively increasing flip angles, stimulated echoes, or signal ratios. The most simple and straightforward of these methods is the double-angle method, which involves acquiring images with two flip angles $\alpha$ and $2\alpha$, where TR>>T1 such that image signal is proportional to $\sin(\alpha)$ and $\sin(2\alpha)$, respectively. The $B_1+$ field is derived from the ratio of signal magnitudes. Previous double-angle approaches have been limited by the requirement of long TRs and therefore long imaging times and motion compensation issues. While accurate in static body regions, these methods are not practical in areas of the body that experience motion, such as the chest and abdomen.

SUMMARY

The invention combines a double-angle method with a $B_1$-insensitive magnetization reset sequence at the end of each data acquisition, which lifts the dependence of TR on $T_1$ and enables rapid imaging, and interleaved spiral readouts, enabling multi-slice acquisition of $B_1+$ maps in a short time (a single breathhold). Phantom and in vivo validation data are presented along with $B_1+$ homogeneity measurements in the heart at 3 T.

The invention and objects and features thereof will be more readily apparent from the following detailed description and appended claims when taken with the drawings.

BRIEF DESCRIPTION OF THE DRAWINGS

FIGS. 5a)-5c) illustrate validation in a human head at 3 T.

DETAILED DESCRIPTION OF ILLUSTRATIVE EMBODIMENTS

Figure 1A:
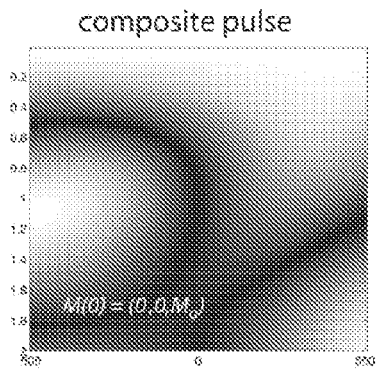
FIGS. 1a)-1f) illustrate Bloch equation simulations showing the performance of $B_1$-insensitive saturation pulses.
Figure 1D:
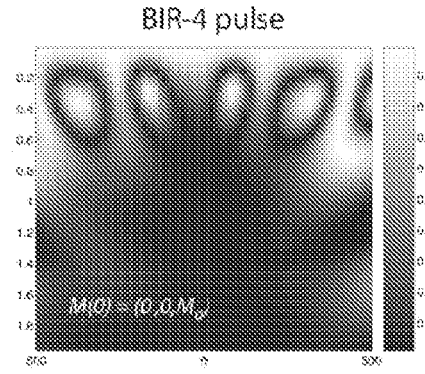
Figure 1B:
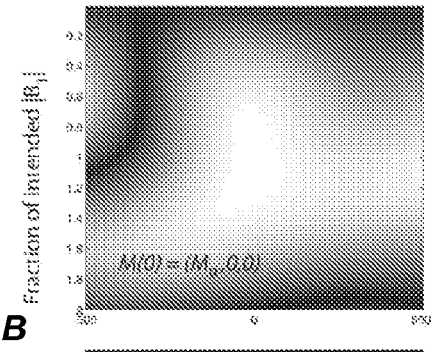
Figure 1E:
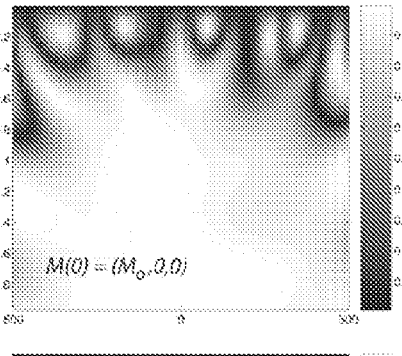
Figure 1C:
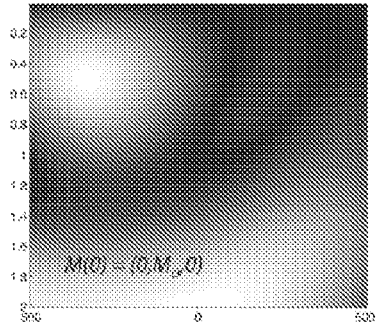
Figure 1F:
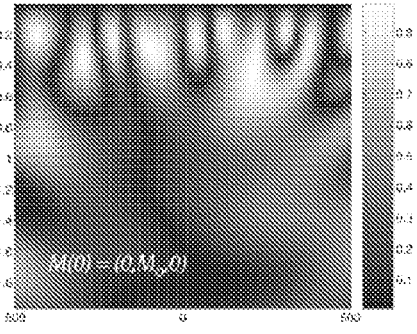
Figure 2A:
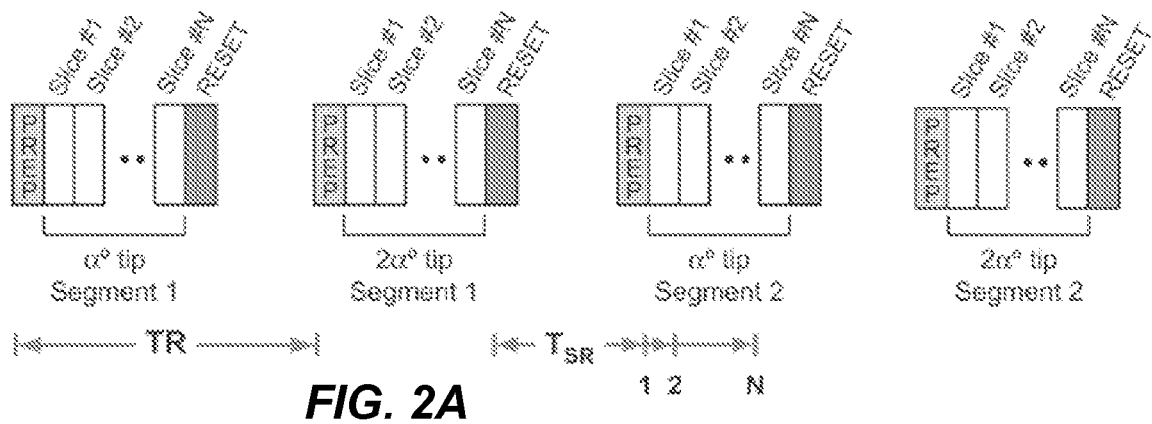
FIGS. 2a)-2d) illustrate SDAM pulse sequence with spiral acquisitions.
Figure 2B:
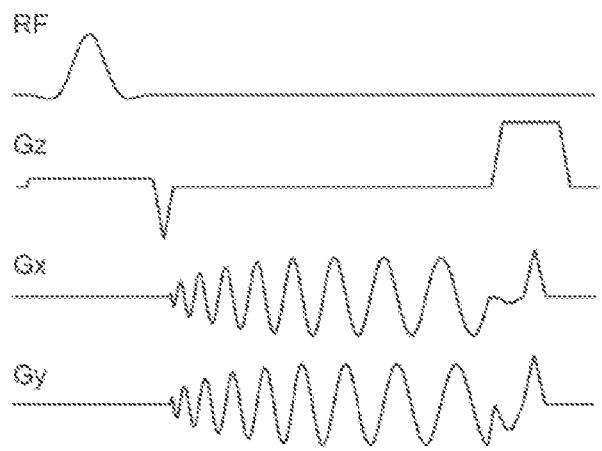
Figure 2C:
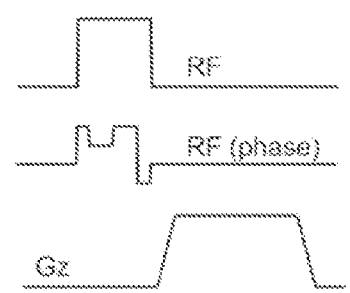
Figure 2D:
Figure 3D:
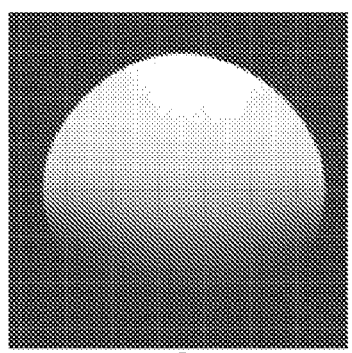
FIGS. 3a)-3d) illustrate a phantom validation study.
Figure 3D:
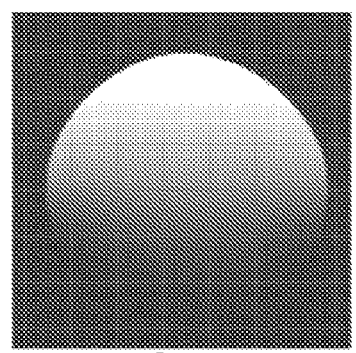
Figure 3D:
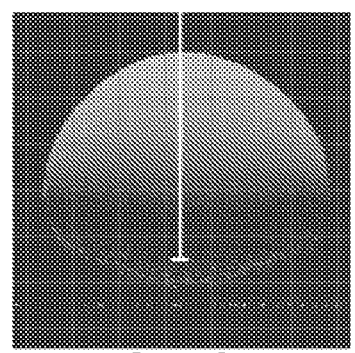
Figure 3D:
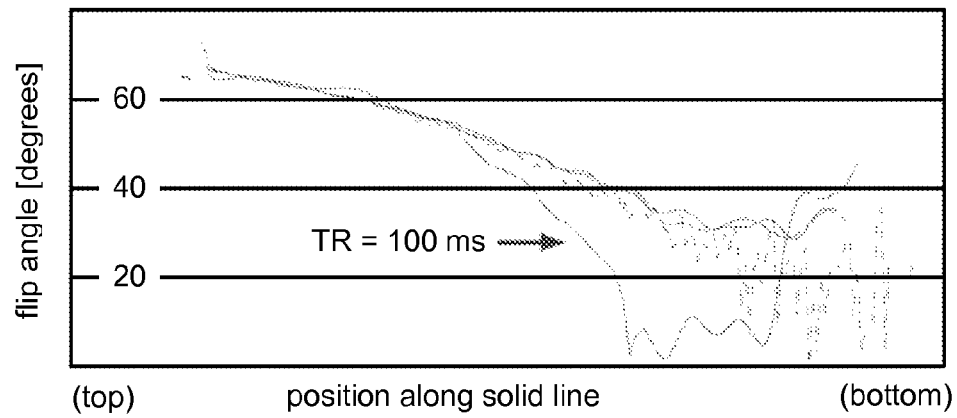
Figure 4A:
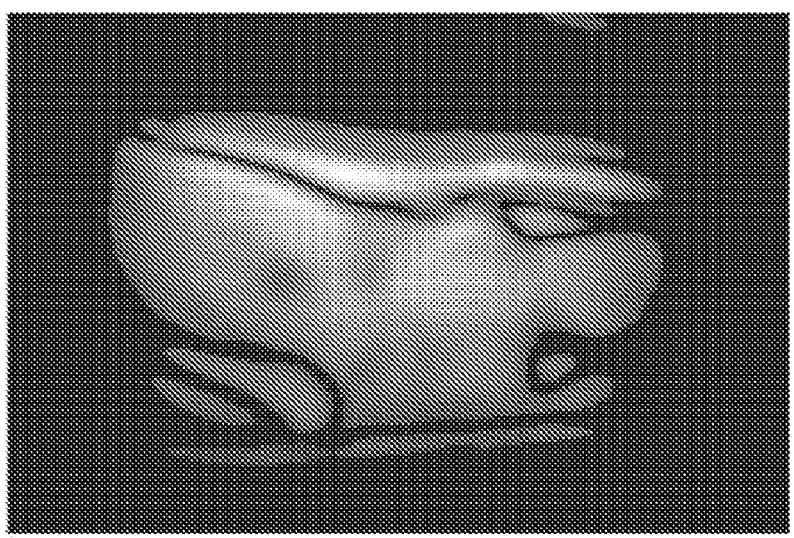
FIGS. 4a)-4c) illustrate validation in a human leg at 1.5 T.
Figure 4B:
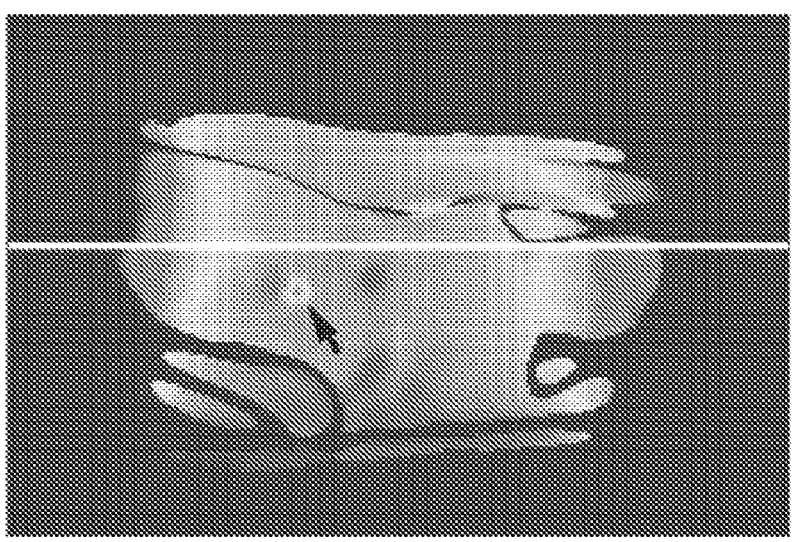
Figure 4B:
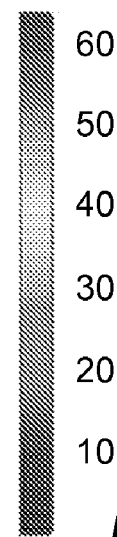
Figure 4C:
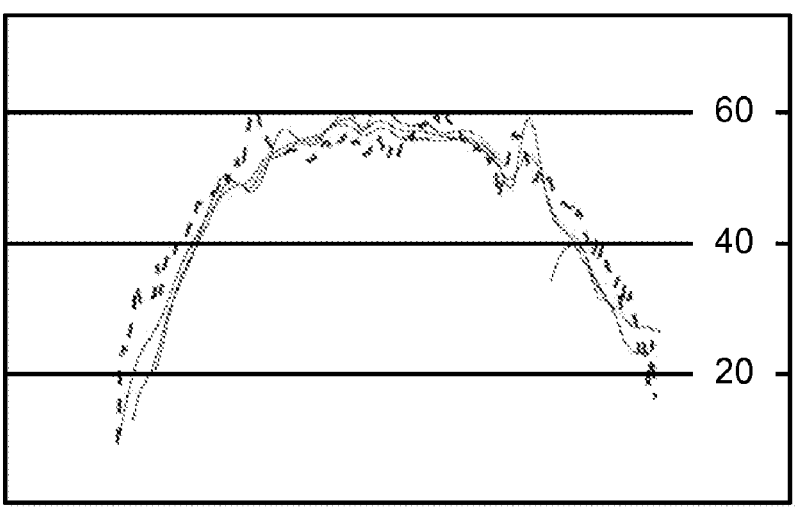

The proposed method uses an adaptation of the double angle method (DAM) described previously. Such methods allow calculation of a flip-angle map, which is an indirect measure of the $B_1+$ field. Two images are acquired: $I_1$ with prescribed tip angle $\alpha_1$ and $I_2$ with prescribed tip angle $\alpha_2=2\alpha_1$. All other signal-affecting sequence parameters are kept constant. For each voxel, the ratio of magnitude images satisfies $$\frac{I_2(r)}{I_1(r)} = \frac{\sin\alpha_2(r) f_2(T_1, TR)}{\sin\alpha_1(r) f_1(T_1, TR)},$$

where r represents spatial position and $\alpha_1(r)$ and $\alpha_2(r)$ are tip angles that vary with the spatially varying $B_1+$ field. If the effects of $T_1$ and $T_2$ relaxation can be neglected, then the actual tip angles as a function of spatial position satisfy $$\alpha(r) = \arccos\left(\left|\frac{I_2(r)}{2I_1(r)}\right|\right).$$

A long repetition time (TR$\geq 5$ $T_1$) is typically used with the double-angle methods so that there is no $T_1$ dependence in either $I_1$ or $I_2$ (i.e., $f_1(T_1,TR)=f_2(T_1,TR)=1.0$). Instead, the proposed method includes a magnetization-reset sequence after each data acquisition with the goal of putting the spin population in the same state regardless of whether the $\alpha$ or $2\alpha$ excitation was used for the preceding acquisition (i.e., $f_1(T_1, TR)=f_2(T_1,TR)\neq 1.0$).

The RF pulse used for saturation of the magnetization must destroy $M_z$ over a range of $B_1+$ values since this sequence is intended for use in areas with inhomogeneous $B_1+$. Two classes of RF pulses that meet this requirement were investigated: composite pulse trains and BIR4 pulses. The performance of these waveforms as saturation pulses is shown in FIG. 1, which shows Bloch equation simulations showing the performance of B1-insensitive saturation pulses: (a-c) The residual longitudinal magnetization after application of a 1.2-ms $45_x$-$90_y$-$90x$-$(45_y)$ composite pulse. The direction of the magnetization before each pulse is shown on the plots. (d-f) The residual longitudinal magnetization after application of an 8-ms BIR-4 pulse (hyperbolic secant envelope with $\lambda=5$, $\zeta=1.6$). Both pulses saturate $M_z$ and leave $M_y$ in the transverse plane (dark regions) as desired, but tip $M_x$ back to the longitudinal axis (see $b$ and $e$). The particular BIR4 pulse investigated is much better in terms of insensitivity to $B_1+$ and $B_0$ inhomogeneity, but comes at the price of a sixfold increase in the pulse duration and in the anticipated specific absorption rate (SAR). An undesired feature of both pulses is that both tip some magnetization back onto the longitudinal axis (see FIGS. 1$b$ and $e$). To reduce the resulting $T_1$ weighting, $T_2$ decay can be relied upon to eliminate this component, or the saturation pulse can be applied multiple times, with crushers in between each pulse.

Imaging Sequence—FIG. 2 illustrates a saturated double angle method (SDAM) pulse and SDAM pulse sequence with spiral acquisitions. Full images are acquired with a prescribed $\alpha$ and prescribed $2\alpha$ flip angle. A $B_1$-insensitive saturation pulse is used to reset the magnetization after each acquisition set. The acquisition of multiple slices is achieved as shown in ($a$). Contrast preparation such as a FAT-SAT can be used prior to imaging. The ($b$) imaging sequence consists of a simple slice-selective excitation followed by a short spiral readout and a dephaser. The ($c$) reset sequence consists of a $B_1$-insensitive and nonspatially selective saturation pulse followed by a dephaser. As shown in ($d$) acquisitions can also be cardiac gated, to prevent cardiac motion artifacts. The pulse sequence comprises an imaging sequence and a magnetization reset sequence. The imaging sequence contains a tip pulse, readout, and gradient spoiler, while the reset sequence contains a nonselective saturation pulse (which is insensitive to both $B_1$ variations and off-resonance) and a gradient spoiler. In one embodiment, the prescribed flip angles prescribed are $\alpha_1=60°$ and $\alpha_2=120°$. In our experiments, spiral readouts were chosen because of their efficiency, good flow properties, and short echo time; however, alternate k-space segmentations such as echo planar imaging (EPI) may be substituted. The spiral readouts were 16 ms in duration, and only a portion of those data were used during reconstruction depending on off-resonance, resolution, and SNR considerations. Gridding reconstruction (non-Cartesian sampling) and coil combination (multicoil imaging) was performed prior to "double-angle" processing.

Because $B_1+$ profiles are usually quite smooth, in cases where SNR was lacking, we opted to use only the first 4 or 8 ms of each readout, which maintains the same FOV, but reduces the spatial resolution ($\Delta x$ $\Delta y$) and reduces the total readout time $T_{read}$. The net effect on SNR is an increase. To reduce ringing artifacts caused by k-space truncation, a radial Hamming window was applied to gridded k-space data before inverse Fourier-transforming.

As shown in FIG. 2, the acquisitions contributing to $I_1$ and $I_2$ are interleaved and can be cardiac gated if necessary. Multiple slices are covered sequentially in each repetition and can share a single contrast preparation pulse (such as a FATSAT) and share a single nonselective magnetization saturation pulse as shown. The imaging excitations are slice selective, while the contrast preparation and saturation pulses are not spatially selective.

Experimental Methods—Studies were performed on GE Signa 1.5 T and 3 T scanners (GE Healthcare, Waukesha, Wis., USA) with EXCITE hardware. Both scanners were equipped with gradients capable of 40 mT/m amplitude and 150 T/m/s slew rate and a receiver capable of 2-μs sampling (±250 kHz). The composite saturation pulse tested in FIG. 1 was used in all SDAM measurements. In phantom studies, a head coil was used for RF transmission and reception. In static in vivo validation studies either a head coil or extremity coil was used for RF transmission and reception. In abdominal and cardiac studies, a body coil was used for RF transmission and four-channel phased array coil was used for signal reception. Synchronization with the cardiac cycle was achieved with prospective triggering based on an infrared plethysmograph that monitors blood volume in a finger. The institutional review boards of Stanford University and the University of Southern California approved the imaging protocols. Each subject was screened for magnetic resonance imaging risk factors and provided informed consent in accordance with institutional policy.

To validate the accuracy of the method, $B_1+$ measurements were made in a phantom and normal volunteers. In the phantom study, the new method was used with TR ranging from 1 s to 100 ms. This was compared with a reference double-angle method consisting of two sequential gradient-echo scans using a long TR of 3 s and Cartesian k-space sampling. The phantom was spherical with 18 cm diameter and consisted of distilled water doped with copper sulfate. The $T_1$ of the phantom was 345 ms as measured using an inversion-recovery sequence. A quadrature transmit/receive head coil was used, with the phantom positioned halfway out the end of the coil to produce an inhomogeneous $B_1+$. A linear transmit/receive extremity coil was used to produced a $B_1+$ map in the leg of a normal volunteer, both with the new method and the reference double-angle method with a long TR (3 s). The $B_1+$ field was inhomogeneous where the leg extended beyond the coil. Last, for comparison with previous studies (4), measurements were made of the $B_1+$ homogeneity in a human head at 3 T using a standard birdcage head coil for RF transmission and signal reception. Maps made with TRs ranging from 3000 to 400 ms were compared.

Abdominal $B_1+$ maps covering the lower liver were acquired in two healthy volunteers at 3 T. Scan planes were localized using a standard three-plane localizer, and six axial slices were prescribed spanning the liver. Fat saturation was used in both subjects. $B_1+$ maps of six slices were acquired in a 16-s scan with a 1-s TR (8 spiral interleaves×2 flip angles). This was repeated with a 500-ms TR (8-s scan) and 250-ms TR (4-s scan).

Cardiac $B_1+$ maps were acquired in four healthy volunteers at 3 T. Short-axis and long-axis views were localized using the GE I-drive real-time system. In each volunteer, eight parallel short axis slices were prescribed spanning the left ventricle from base to apex (base was slice 1 and apex was slice 8). Fat saturation was used in all subjects. Acquisitions were cardiac gated (using a plethysmograph), with imaging occurring in mid-diastole, and were performed during breathholds. Whole-heart coverage was achieved in a single breathhold of 20 R-R intervals (14 to 25 s with heart rates of 48 to 85 beats/min).

Static Validation—FIG. 3 contains images and flip angle profiles from the ball phantom experiment with the ball at the edge of a transmit-receive head coil, producing a highly inhomogeneous $B_1+$ field. In this study, a large ball phantom ($T_1$ of 345 ms) was centered at the end of a birdcage head coil. Half of the phantom was within the coil, and half was outside. The top row contains ($a$) the $2\alpha$ flip angle image, ($b$) the $\alpha$ flip angle image, and ($c$) the computed flip angle map, all with TR=3 s and with a line showing the column plotted in ($d$). Plots of the flip angle variation are shown in ($d$), with the dashed line showing the reference (long TR) and the solid lines showing measurements with SDAM with TR of 1000, 500, and 100 ms overlapping. The discrepancy between the 100-ms curve and the others is discussed in the text. The scan time with 500 ms TR was 8 s. The in-plane resolution was 2 mm and the slice thickness was 5 mm. The flip angle profiles measured with the reference method and with SDAM are shown in FIG. 3d. Good agreement with the reference method (dashed line) was observed. As TR is reduced, the SNR decreases (due to reduced $T_1$ recovery time), but there is no identifiable distortion in the flip angle profile. The curve for TR=100 ms deviates from the others in the region with very low SNR. This was investigated and was found to result from low-amplitude artifacts in the spiral images. These artifacts are likely due to system instabilities and only became significant relative to the desired signal when the SNR is low.

FIG. 4 contains images and flip angle profiles from the human leg experiment in the extremity coil. The validation in a human leg at 1.5 T includes (a) anatomic image, (b) $B_1$+ map, (c) $B_1$+ profiles along the line shown in (b) using DAM (TR=3 s, dashed line), and SDAM with TR=1 s, 500 ms, and 100 ms (solid lines). The arrow indicates a region with short $T_2$ where an error in the $B_1$ map occurs. The scan time with TR of 100 ms was 1.6 s. The in-plane spatial resolution after windowing was 7 mm and the slice thickness was 5 mm. Again, the profiles collected with SDAM (FIG. 4c) show excellent agreement with each other and with the reference. As TR is reduced, the SNR moderately decreases, as expected. It is interesting to note that tissues with sufficiently short $T_2$ cause an error in the $B_1$+ map (arrow) because, for these tissues, flip angle will not scale linearly with RF amplitude.

FIG. 5 illustrates validation in a human head at 3 T with (a) The α image and (b) the computed flip angle map and (c) plots of the flip angle variation in the left/right direction, acquired with SDAM with TR of 2000 (solid) and 400 ms (dashed). The scan time with TR of 400 ms was 10 s. The images in (a, b) are from the TR=2000 ms scan. As expected, the $B_1$+ profile is parabolic in shape. The in-plane spatial resolution after windowing was 4.2 mm and the slice thickness was 5 mm. The Figure contains images and flip angle profiles from a human head scan at 3 T. The SDAM profiles collected with TR of 2 s and 400 ms show excellent agreement, even for TR<$T_1$. The anatomic image shows the expected center brightening that can result from dielectric effects, and the flip angle map shows a corresponding elevation toward the center of the head. It should be noted that the center brightening seen in FIG. 5a is due to a combination of the effects of $B_1$+ during transmit and $B_1$− during signal acquisition, with the spatial pattern for each being different. By using the ratio of signals, the $B_1$− distribution is factored out in double-angle methods such as SDAM. The observed flip angle elevation is in agreement with other published flip angle measurements in the head at 3 T (4).

Figure 6A:
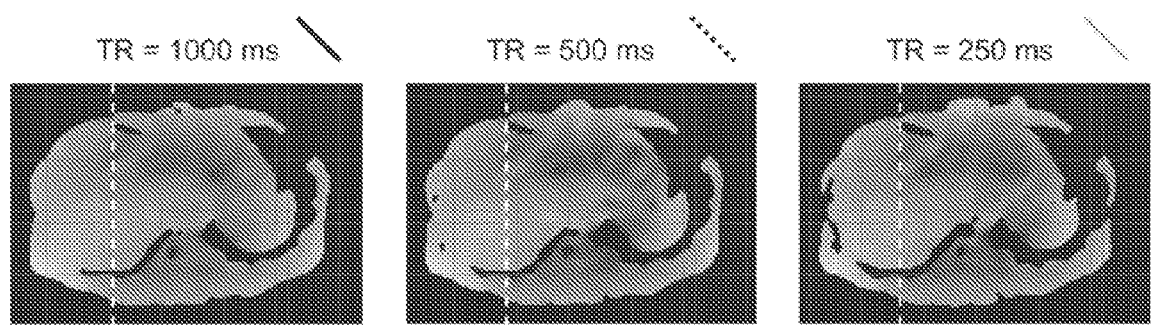
FIGS. 6a)-6b) illustrate Abdominal $B_1+$ maps in a healthy volunteer at 3 T with short repetition times.
Figure 6B:
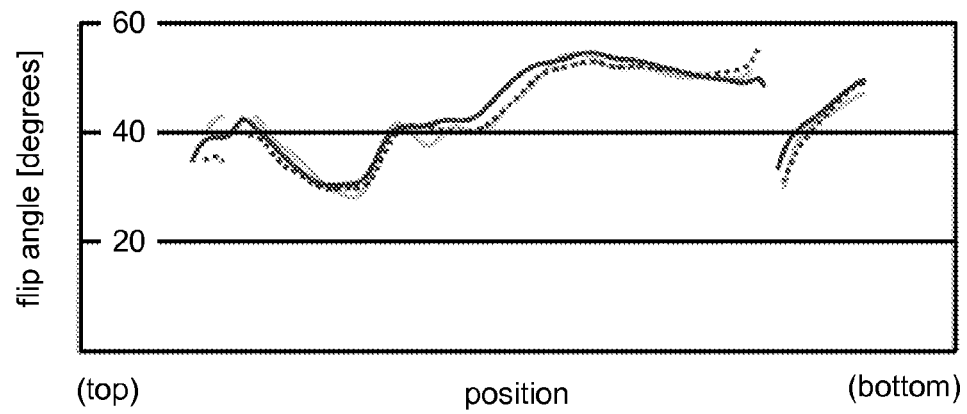

Breath-Held Measurements—Representative abdominal $B_1$+ maps from one volunteer are shown in FIG. 6. Here are abdominal $B_1$+ maps in a healthy volunteer at 3 T with short repetition times. A six-slice acquisition was repeated with TR=1 s, 500 ms, and 250 ms, with acquisition time of each scan being 16×TR. Flip angle maps (black=0°, white=60°) of slice 4 from all three datasets are shown in (a), with the flip angles along the dotted line plotted in (b). Note that the flip angle maps retain accuracy even for short TRs, with the primary side effect being lowered SNR due to the shorter saturation recovery time. The in-plane spatial resolution after windowing was 10 mm and the slice thickness was 5 mm. Six slices were acquired in a single breath-hold. Focusing on the fourth slice, FIG. 6 contains the flip angle maps derived using the three different TRs. Except for moderately decreased SNR, there were no identifiable artifacts observed when TR was shortened.

Figure 7:
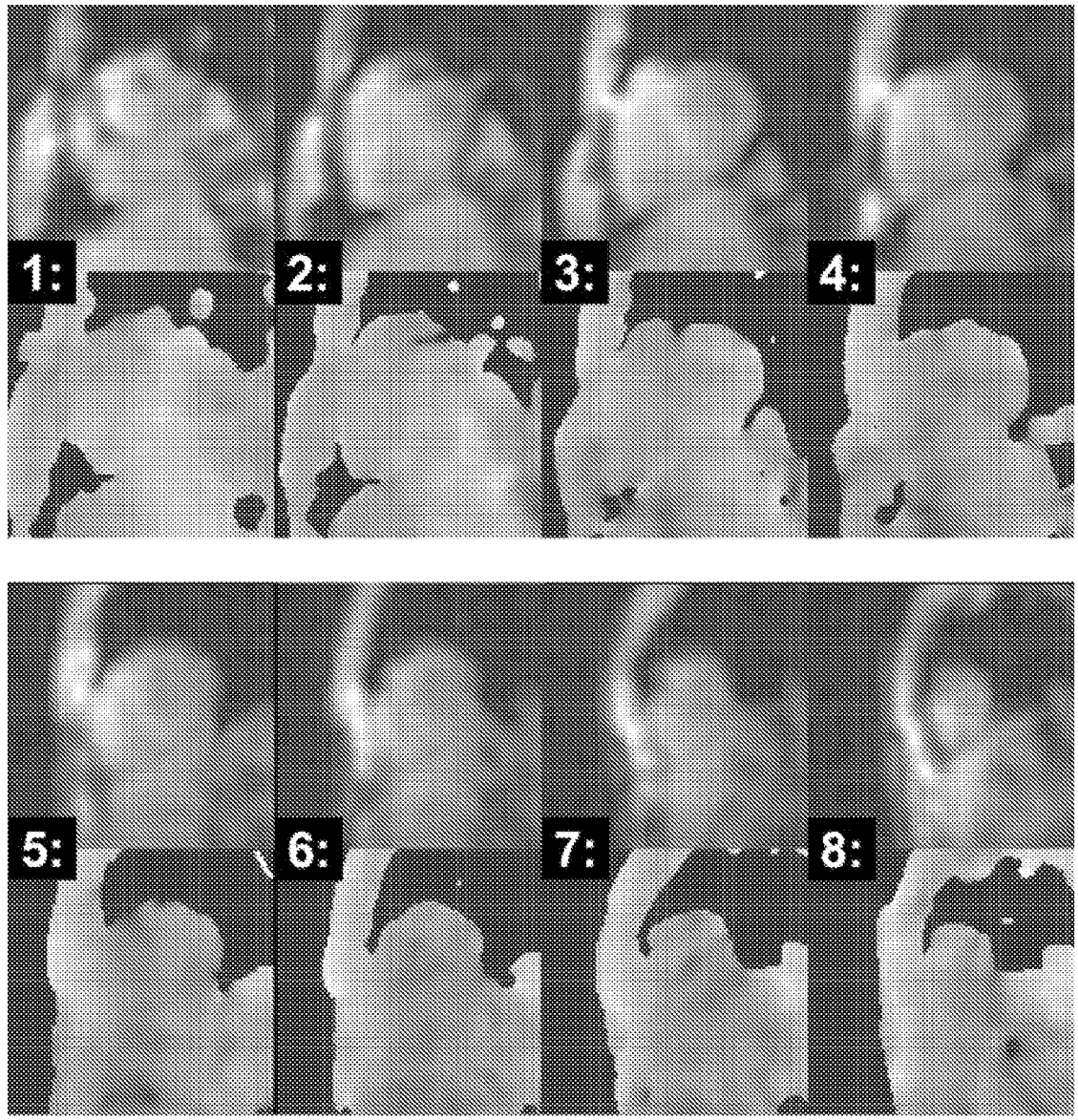
FIG. 7 illustrates Cardiac $B_1+$ maps in a healthy volunteer at 3 T.
Figure 8D:
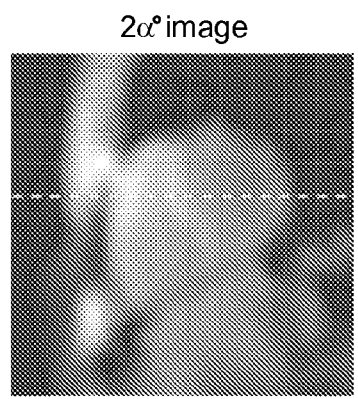
FIGS. 8a)-8d) illustrate Cardiac $B_1+$ maps in a healthy volunteer at 3 T.
Figure 8D:
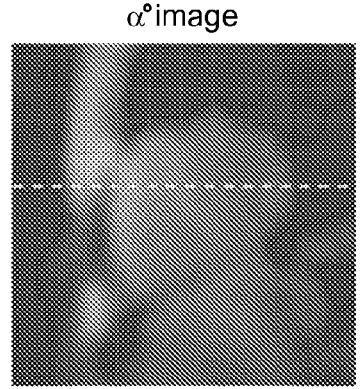
Figure 8D:
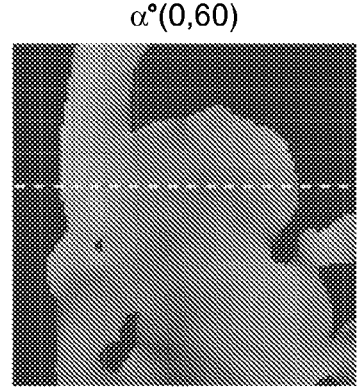
Figure 8D:
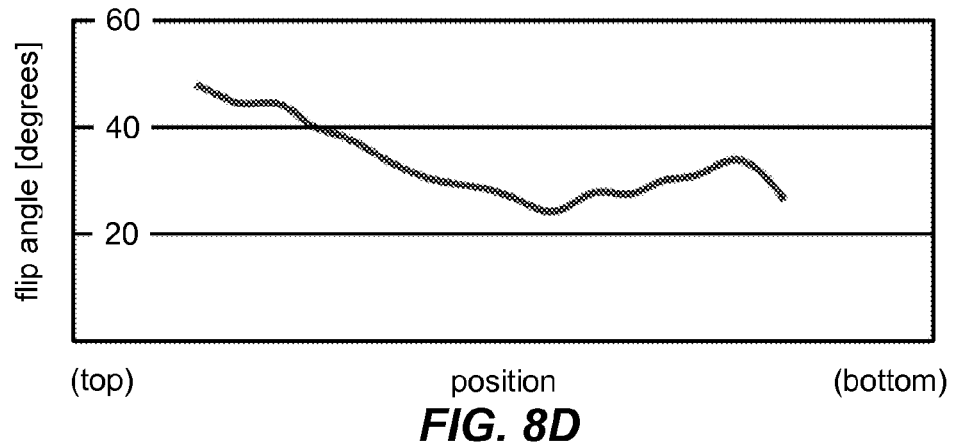

Representative cardiac $B_1$+ maps are shown in FIGS. 7 and 8. FIG. 7 shows Cardiac $B_1$+ maps in a healthy volunteer at 3 T. $B_1$+ maps of eight parallel slices were acquired in one 18-s breathhold. For each slice, magnitude images (top row) and flip angle maps (bottom row) are shown with black=0 and white=60°. Note that the eight slices are of slightly different cardiac phase and that SNR is sufficiently high. The in-plane resolution after windowing was 10 mm and the slice thickness was 5 mm. FIG. 8 shows cardiac $B_1$+ maps in a healthy volunteer at 3 T, and (a-c) show the magnitude images and flip angle map from a mid short axis slice (slice 4 from FIG. 7). The flip angles along the dotted line are shown in (d), illustrating experienced flip angles between 22 and 50°, when a 60° flip angle was prescribed. The in-plane resolution after windowing was 10 mm and the slice thickness was 5 mm. Magnitude images and flip angle maps for all slices are shown in FIG. 7. Focusing on a mid-short axis slice (slice 4), FIG. 8 contains magnitude images for I1 and I2, along with the derived flip angle map. Plotting a line through the image, $B_1$+ appears to decrease for locations further from the chest wall and rise again closer to the midpoint of the body. It is also interesting to note that for a prescribed flip angle of 60° (with transmit gain calibrated using standard prescan), the flip angles experienced by myocardium were actually in the 25-45° range, which is a substantial deviation.

The level of inhomogeneity observed (100%) and the general shape of $B_1$+ variation are consistent with published references, and with SDAM, were acquired in substantially shorter scan time.

SNR of the acquired images is dependent on the saturation recovery time $T_{SR}$, with image SNR α$1-e^{-TSR/T1}$. As a natural consequence, shorter TRs result in lower $T_{SR}$ (see FIG. 2a), lower SNR, and noisier $B_1$+ maps. In addition, because the different slices in a multislice acquisition have different recovery times, SNR of the $B_1$+ maps increases from the first slice to the last. When using a very short TR, it may be beneficial to place the most important slices last in the multislice acquisition block (see FIG. 2). In addition, the double-angle method uses a nonlinear computation, Eq. [2], which results in further noise amplification in areas where α (r) is small (near 0°) or large (near 90°). To mitigate problems associated with low SNR the image resolution was limited to pixel sizes of several millimeters. A Hamming window was applied to the truncated k-space data in order to reduce ringing artifacts. Because of the circular k-space coverage, a Hamming window that varied with the k-space radius was used. The effect of this windowing operation is a slightly lower spatial resolution than would be expected from the extent of the data in k-space. This effect will be negligible in most cases because $B_1$+ variations are typically smooth.

The key component of the proposed sequence is the robust magnetization saturation. The effectiveness of the saturation used in these experiments was demonstrated by varying the TR and this showed negligible change in the $B_1$+ maps. Although a short composite pulse was used here, there are many possibilities for saturation pulses that are insensitive to $B_1$ and $B_0$ inhomogeneity and the appropriate pulse can be chosen for different applications. It is likely that the most robust method would be a long train of adiabatic refocusing pulses; however, this would come at a price in minimum TR and RF heating. The basic idea of resetting the magnetization to remove $T_1$ weighting could be extended to other methods for measuring $B_1$+ as well, such as phase-based methods in which the flip angle is converted into phase in the transverse plane by applying a 90° ($B_1$+ insensitive) plane-rotation pulse.

With very short TR, such as when TR<<$T_2$, there is a possibility that stimulated echoes could form. These can be avoided by modulating the size of the dephaser after the saturation pulse. Given that the total number of applications of the saturation pulse is not large (twice the number of spiral interleaves), dephasers with relative areas that are geometrically increased could be used to remove the possibility of stimulated echoes.

The current multislice acquisition may be affected by flow between acquisitions. The use of a spatially nonselective saturation pulse alleviates this problem to some degree, as all magnetization within the sensitive region of the transmit coil (and within the parameters of the particular saturation pulse; see FIG. 1) will be saturated. However, spins from adjacent slices may flow into one another during the multislice acquisition, disturbing the steady state established by the saturation pulse. However, this effect will be fairly consistent from measurement to measurement if cardiac gating is used. If flow is irregular, $B_1+$ estimates in blood or regions of flow may be discarded. This is not an issue for single-slice mapping.

For cardiac applications, there is the consideration of arrhythmia, or otherwise irregular R-R intervals. This will cause unequal amounts of saturation recovery time among k-space segments, which can result in image artifacts, and errors in the $B_1+$ maps that have not been yet been analyzed. Also, our initial implementation requires a breathhold, which some patients may not be able to perform. However, with the introduction of a navigated acquisition, these limitations can be alleviated.

There are numerous applications for $B_1+$ information that are anticipated to be useful. One possibility is adjusting the RF power dynamically to achieve the desired flip angle in regions of interest. Also, it is possible to design RF pulses "on-the-fly" to compensate for smoothly varying $B_1+$ components. For some applications, such as transmit SENSE, a flip-angle dynamic range may be required that is larger than that supported with the arccos relationship of Eq. [2] (about 20 dB). In this case, the method could be applied multiple times, with the flip angle increased upon successive measurements to improve the dynamic range. The speed of the method makes such multiple acquisition schemes feasible. Besides the flip angle, the phase of the $B_1+$ field may also be desired. To do this, an additional data acquisition could be performed using an adiabatic half-passage for the excitation pulse. The x- and y-components of the resulting magnetization would correspond to the x- and y-components of $B_1+$.

$B_1+$ mapping is becoming an integral part of prescan calibration in high-field MRI and MRI with surface transmit coils. The SDAM in accordance with the invention can yield volumetric $B_1+$ maps with adequate spatial resolution in just a few seconds. This has substantial implications for high-field neuroimaging and for the first time enables rapid cardiac and abdominal $B_1+$ mapping within the duration of a breath-hold (necessary for time-efficient motion suppression).

While the invention has been described with reference to specific embodiments, the description is illustrative of the invention and is not to be construed as limiting the invention. Various modifications and applications may occur to those skilled in the art without departing from the spirit and scope of the invention as defined by the appended claims.

What is claimed is:

1. A method of mapping a field of a RF Excitation pulse $(B_1+)$ in the presence of a static field $(B_0)$ for magnetic resonance imaging (MRI), comprising the steps of:
   a) acquiring MRI signals in response to RF excitation pulse sequences alternately applied at two flip-angles, and
   b) for each RF excitation pulse sequence at one flip angle, applying a reset pulse sequence for returning excited nuclei spins to a pre-excitation state, wherein the reset pulse sequence includes a first $B_1$-insensitive and non-spatially selective saturation pulse and a second spin dephaser pulse.

2. The method of claim 1, further comprising the step of:
   c) using a ratio of the MRI signals acquired with the two flip angles as a measure of field of the RF excitation pulse for mapping the field of the RF excitation pulse in the presence of a static field.

3. The method of claim 2 wherein steps a) and b) are performed for each image reconstruction MRI acquisition.

4. The method of claim 1 wherein the second pulse follows the first pulse.

5. The method of claim 1 wherein the two flip-angles for the RF excitation pulse sequences are $\alpha_1$ and $\alpha_2$, wherein $\alpha_2=2\alpha_1$.

6. The method of claim 5 wherein step a) includes interleaved multislice MRI signal acquisitions.

7. The method of claim 6 wherein the interleaved signal acquisitions are k-space spiral readouts.

8. The method of claim 5 wherein in step a) the ratio of the acquired signals $I_1$ and $I_2$ for flip-angle $\alpha_1$ and $\alpha_2$, respectively, at spatial position, r, are indicative of the $B_1+$ field at position r.

9. The method of claim 8 wherein step a) includes interleaved multislice MRI signal acquisitions.

10. The method of claim 9 wherein the interleaved signal acquisitions are k-space spiral readouts.

11. The method of claim 10 wherein steps a) and b) are performed for each image reconstruction MRI acquisition.

12. The method of claim 8 wherein steps a) and b) are performed for each image reconstruction MRI acquisition.

* * * * *